United States Patent
Niimi et al.

(10) Patent No.: US 11,134,561 B2
(45) Date of Patent: Sep. 28, 2021

(54) WIRING BOARD AND METHOD FOR PRODUCING THE SAME

(71) Applicant: Panasonic Intellectual Property Management Co., Ltd., Osaka (JP)

(72) Inventors: Hideki Niimi, Osaka (JP); Shinji Takano, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/796,023

(22) Filed: Feb. 20, 2020

(65) Prior Publication Data

US 2020/0314996 A1    Oct. 1, 2020

(30) Foreign Application Priority Data

Mar. 28, 2019    (JP) .............................. JP2019-064555

(51) Int. Cl.
| | | |
|---|---|---|
| *H01L 23/40* | (2006.01) | |
| *H05K 1/02* | (2006.01) | |
| *H05K 3/34* | (2006.01) | |
| *H05K 7/20* | (2006.01) | |

(52) U.S. Cl.
CPC ............. *H05K 1/021* (2013.01); *H01L 23/40* (2013.01); *H05K 3/3442* (2013.01); *H05K 7/20* (2013.01); *H05K 2201/066* (2013.01); *H05K 2201/09063* (2013.01)

(58) Field of Classification Search
None
See application file for complete search history.

(56) References Cited

U.S. PATENT DOCUMENTS

| | | | | |
|---|---|---|---|---|
| 5,926,371 | A * | 7/1999 | Dolbear | H01L 23/4006 |
| | | | | 174/138 G |
| 6,223,815 | B1 * | 5/2001 | Shibasaki | F28F 13/00 |
| | | | | 165/185 |
| 7,518,235 | B2 * | 4/2009 | Coico | H01L 23/4006 |
| | | | | 257/719 |
| 8,508,031 | B2 * | 8/2013 | Hayashi | H01L 23/433 |
| | | | | 257/688 |
| 9,883,612 | B2 * | 1/2018 | Achard | H05K 7/20409 |
| 2011/0133329 | A1 | 6/2011 | Takahashi | |
| 2011/0147918 | A1 * | 6/2011 | Hayashi | H01L 23/433 |
| | | | | 257/692 |
| 2018/0114735 | A1 * | 4/2018 | Nakamura | H01L 23/315 |

FOREIGN PATENT DOCUMENTS

JP    5271886    8/2013

* cited by examiner

*Primary Examiner* — Courtney L Smith
(74) *Attorney, Agent, or Firm* — Wenderoth, Lind & Ponack, L.L.P.

(57) ABSTRACT

A wiring board includes a rod-shaped shaft member including at one end a flange that has a larger diameter than any other portion, a heat-releasing plate including a first through-hole in which the shaft member is inserted, and a board including a second through-hole in which the shaft member is inserted. In the wiring board, a gap is formed at least in part between the heat-releasing plate and the board.

11 Claims, 10 Drawing Sheets

WIRING BOARD AND METHOD FOR PRODUCING THE SAME

CROSS REFERENCE TO RELATED APPLICATIONS

This application is entitled to the benefit of Japanese Patent Application No. 2019-064555, filed on Mar. 28, 2019, the present disclosure of which including the specification, drawings and abstract is incorporated herein by reference in its entirety.

TECHNICAL FIELD

The present disclosure relates to a structure of a wiring board, and a method for producing the wiring board.

BACKGROUND ART

A conventionally known board of this type is one in which a heat-releasing plate is disposed on a first main surface of a wiring board so that a side of a convex part of the heat-releasing plate is opposite to an inner wall of a thorough-hole, and then part of the side of the convex part of the heat-releasing plate is brought into contact with the inner wall of the through-hole of the wiring board by pressing a groove formed on a main surface of the convex part of the heat-releasing plate to fix the heat-releasing plate to the wiring board (Patent Literature (hereinafter, referred to as "PTL") 1).

CITATION LIST

Patent Literature

PTL 1
Japanese Patent No. 5271886

SUMMARY OF INVENTION

Technical Problem

In PTL 1 mentioned above, however, the heat-releasing plate easily overheats and thermal conduction to the wiring board becomes high when the contact area between the heat-releasing plate and the wiring board is wide and heat generation from a packaged semiconductor element is large. For this reason, PTL 1 has a problem that a component mounted on the wiring board is exposed to a high temperature and reliability of the component decreases.

An object of an aspect of the present disclosure is to provide a wiring board having low thermal conduction to a component packaged on the wiring board while maintaining a high heat-releasing effect.

Solution to Problem

The wiring board according to an aspect of the present disclosure comprises a rod-shaped shaft member including at one end a flange that has a larger diameter than any other portion; a heat-releasing plate including a first through-hole in which the shaft member is inserted; and a board including a second through-hole in which the shaft member is inserted, wherein a gap is formed at least in part between the heat-releasing plate and the board.

Advantageous Effects of Invention

The present disclosure makes it possible to provide a wiring board capable of suppressing thermal conduction from a heat-releasing plate to a board.

DESCRIPTION OF EMBODIMENTS

Hereinafter, embodiments of the present disclosure are described with reference to drawings. Each embodiment described below indicates a specific example. The numerical values, shapes, materials, constituents, positions and connection forms of constituents, orders of steps, and the like indicated in the embodiments below are exemplary and do not limit the present disclosure.

Embodiment 1

<Heat-Releasing Plate 1>

Figure 1A:
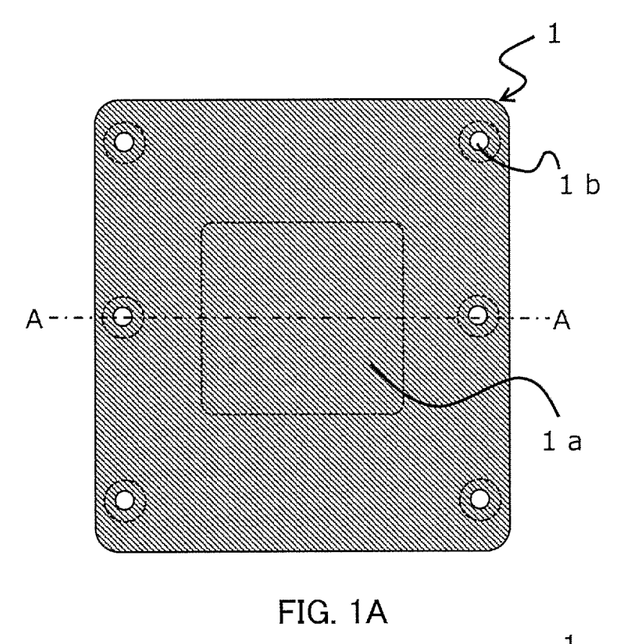
FIG. 1A is a plan view of a heat-releasing plate and FIG. 1B is a cross-sectional view taken along line A-A of FIG. 1A in Embodiment 1 of the present disclosure.
Figure 1B:
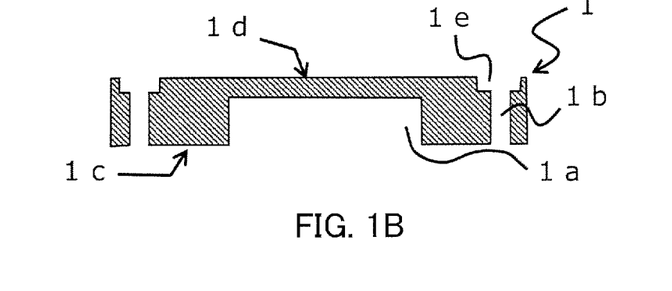

FIG. 1A is a plan view of heat-releasing plate 1 in Embodiment 1 of the present disclosure. FIG. 1B is a cross-sectional view taken along line A-A of heat-releasing plate 1 in Embodiment 1 of the present disclosure.

As illustrated in FIGS. 1A and 1B, first through-holes 1b are formed in heat-releasing plate 1 for positioning with board 2 (see FIG. 2) and for inserting e.g. rivets 3 (see FIG. 3) as shaft members. First through-hole 1b is formed to penetrate heat-releasing plate 1. In planar view (when viewing board 2 on the upper surface; the same applies hereinafter), a total of six first through-holes 1b are formed: four first through-holes 1b one of which is formed in each of the four corners of heat-releasing plate 1, and two first through-holes 1b one of which is formed in each of the right and left positions crossed by line A-A of the cross-section. In heat-releasing plate 1, cavity 1a is formed by a recess formed on a side of front surface 1c in contact with board 2, so as to be capable of corresponding to the height of components to be mounted on board 2. In heat-releasing plate 1, recessed portion 1e is further formed in rear surface 1d on a side of heat-releasing plate 1 in which rear surface 1d is opposite to front surface 1c on a side of heat-releasing plate 1.

Heat-releasing plate 1 has a function of releasing heat from a semiconductor element, an electronic component or board 2. In addition, the material of heat-releasing plate 1 needs to have high thermal conductivity so as to efficiently release heat that board 2 and components to be mounted generate. The material of heat-releasing plate 1 is preferably a resin material or a metal material. The present embodiment uses, for instance, copper. In addition, 4 μm of a Ni layer and 0.05 μm of an Au film thereupon are formed by an electroplating method so that the components to be mounted are packaged in a highly reliable state. The method for forming films on heat-releasing plate 1 is not limited to the plating of Ni and Au films, but may be, for instance, Sn plating or Ag plating depending on the type of surface treatment of the components to be mounted. First through-hole 1b is formed to have a diameter of 2.2 mm.

<Board 2>

Figure 2A:
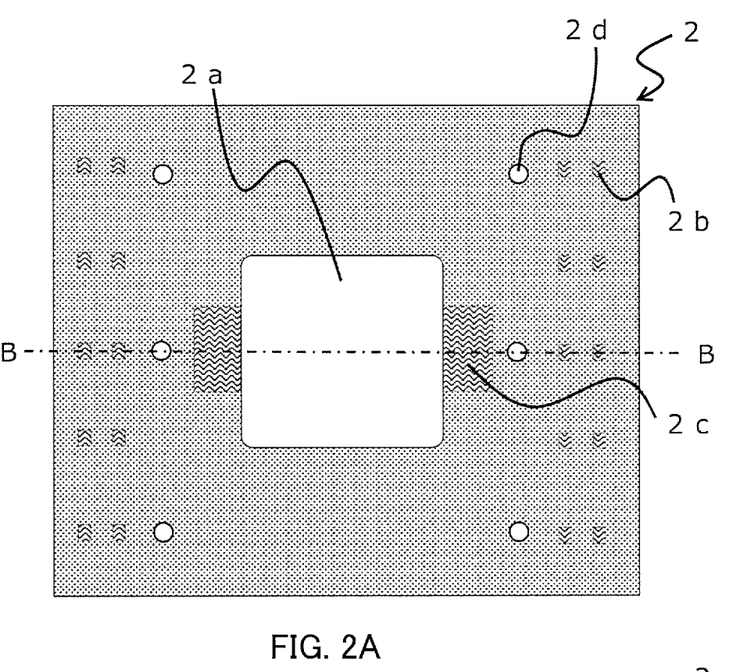
FIG. 2A is a plan view of a board and FIG. 2B is a cross-sectional view taken along line B-B of FIG. 2A in Embodiment 1 of the present disclosure.
Figure 2B:
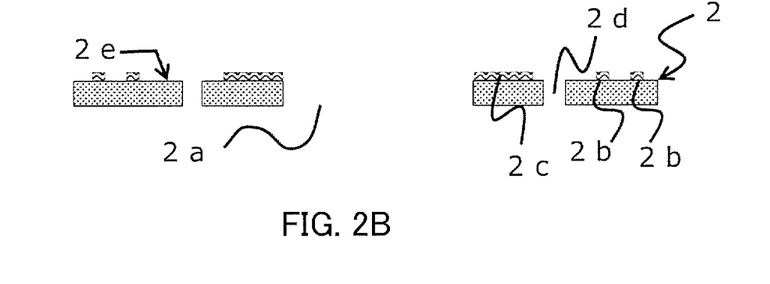

FIG. 2A is a plan view of board 2 in Embodiment 1 of the present disclosure. FIG. 2B is a cross-sectional view taken along line B-B of board 2 in Embodiment 1 of the present disclosure. As illustrated in FIGS. 2A and 2B, second through-holes 2d are formed in board 2 for positioning with heat-releasing plate 1 and for inserting rivets 3 described below. First through-hole 1b and second through-holes 2d are disposed coaxially by positioning.

Board 2 is for mounting a semiconductor element or an electronic component thereon. In planar view, opening 2a, first component land 2b, and second component land 2c are formed in board 2. Opening 2a is for mounting a component, in the middle in planar view, on rear surface 1d of heat-releasing plate 1 in which rear surface 1d is opposite to surface 1c of heat-releasing plate 1 and faces a side of board 2. First component land 2b is for mounting a chip component thereon. Second component land 2c is for mounting a semiconductor package to the right and left of opening 2a in planar view. First component land 2b and second component land 2c are formed by the method of forming 4 μm of a Ni layer and 0.05 μm of an Au film thereupon on a silver foil by an electroplating method. Second through-hole 2d is formed to have a diameter of 2.2 mm in the same fashion as first through-hole 1b.

Second through-hole 2d of board 2 and first through-hole 1b of heat-releasing plate 1 are formed to have a diameter larger than the diameter of the columnar portion of rivet 3 so that rivet 3 can be inserted therein. Second through-hole 2d is preferably formed to have a diameter larger than the diameter of the columnar portion of rivet 3, for instance, by 5 to 30%. First through-hole 1b is preferably formed to have a diameter larger than the diameter of the columnar portion of rivet 3, for instance, by 1 to 10%. The reason why the diameter of second through-hole 2d of board 2 relative to rivet 3 is formed to be larger than the diameter of first through-hole 1b relative to rivet 3 is to prevent heat from heat-releasing plate 1 from being transmitted to board 2 via rivet 3 by forming clearance 7a as a gap between rivet 3 and second through-hole 2d.

<Rivet 3>

Rivet 3 has a columnar shape. In rivet 3, flange 3a having a larger diameter than the diameter of the columnar portion and the inner diameters of second through-hole 2d and first through-hole 1b is formed at one end portion (one end). In addition, an insertion tip for inserting rivet 3 into second through-hole 2d and first through-hole 1b is further formed at the other end portion of rivet 3. Rivet 3 preferably has a linear expansion coefficient close to that of heat-releasing plate 1 because the other end portion of rivet 3 is caulked to come into contact with heat-releasing plate 1. For this reason, the material of rivet 3 is preferably a resin material or a metal material as with heat-releasing plate 1 and is the same material as that of heat-releasing plate 1. The present embodiment uses, for instance, copper.

Heat-releasing plate 1 is subjected to surface treatment so that components to be mounted can be packaged in a reliable state because the components are directly mounted on heat-releasing plate 1. With respect to rivet 3, on the other hand, surface treatment such as plating treatment may be omitted since no components are mounted on rivet 3, and rivet 3 is for being inserted into first through-hole 1b. Furthermore, the columnar portion of rivet 3 has a diameter of 2.0 mm with a 0.2 mm margin relative to the diameter of first through-hole 1b of 2.2 mm and the diameter of second through-hole 2d of 2.2 mm.

TABLE 1

| Embodiment | Diameter of first through-hole (1b, 21b) | Diameter of second through-hole (2d, 32d) | Diameter of the columnar portion of rivet 3 |
| --- | --- | --- | --- |
| Embodiment 1 | 2.2 mm | 2.2 mm | 2.0 mm |
| Embodiment 2 | 2.05 mm | 2.2 mm | 2.0 mm |

Table 1 shows the dimensions of first through-hole 1b of heat-releasing plate 1, second through-hole 2d of board 2, and rivet 3. To clarify the difference between Embodiments 1 and 2, Table 1 also describes the dimensions of first through-hole 21b of heat-releasing plate 21, second through-hole 32d of board 32, and rivet 3 in Embodiment 2 described below. The differences between the respective dimensions are described in detail with respect to the description of the subsequent steps.

<Laminating, Positioning, and Temporarily Fixing Step>

FIGS. 3 to 7 illustrate a method for producing a wiring board in Embodiment 1 of the present disclosure. FIG. 3A is a plan view in which heat-releasing plate 1 and board 2 are positioned and are temporarily fixed in Embodiment 1 of the present disclosure. FIG. 3B is a cross-sectional view taken along line C-C of FIG. 3A in which heat-releasing plate 1 and board 2 are temporarily fixed in Embodiment 1 of the present disclosure. FIG. 4A is a cross-sectional view in which heat-releasing plate 1 and board 2 are caulked in Embodiment 1 of the present disclosure. FIG. 4B is an enlarged cross-sectional view of the caulked portion and corresponding to the left portion of FIG. 4A.

Figure 3A:
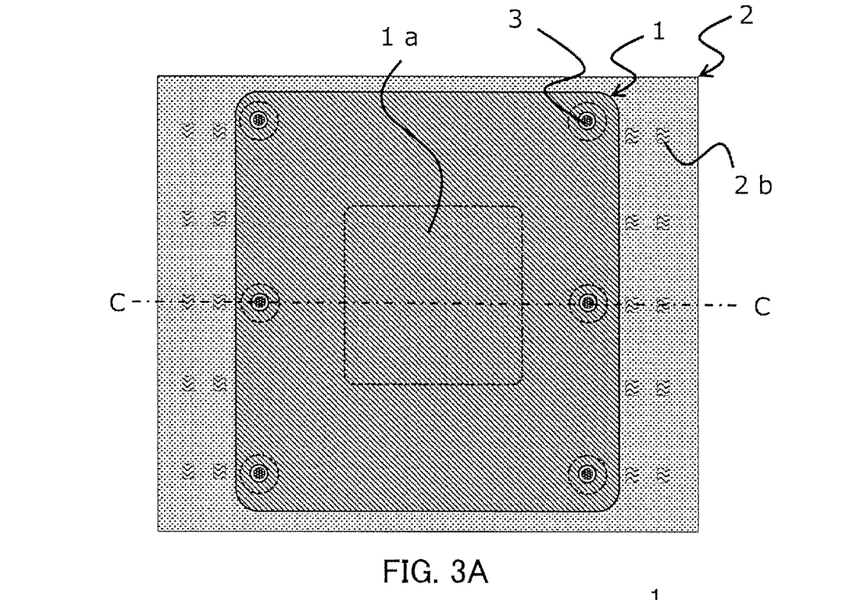
FIG. 3A is a plan view in which the heat-releasing plate and the board are temporarily fixed and FIG. 3B is a cross-sectional view taken along line C-C of FIG. 3A in Embodiment 1 of the present disclosure.
Figure 3B:
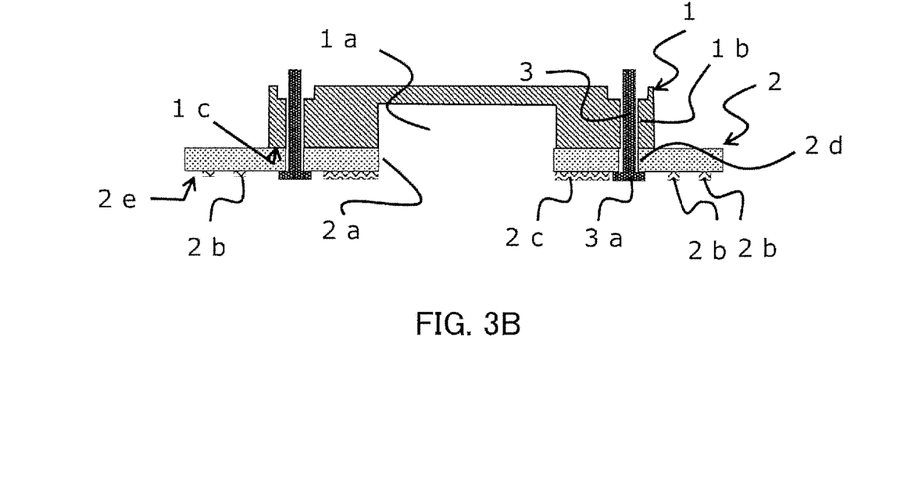

As illustrated in FIGS. 3A and 3B, front surface 1c of heat-releasing plate 1 and the opposite surface to front surface 2e of board 2 are positioned to face each other by lamination.

Heat-releasing plate 1 and board 2 are positioned so that first through-hole 1b and second through-hole 2d mutually communicate, and heat-releasing plate 1 and board 2 are disposed so that six first through-holes 1b and six second through-holes 2d corresponding thereto mutually communicate.

Thereafter, rivet 3 is inserted into second through-hole 2d from a side of front surface 2e of board 2 and into first through-hole 1b to position and temporarily fix heat-releasing plate 1 and board 2.

<Caulking Step>

Figure 4A:
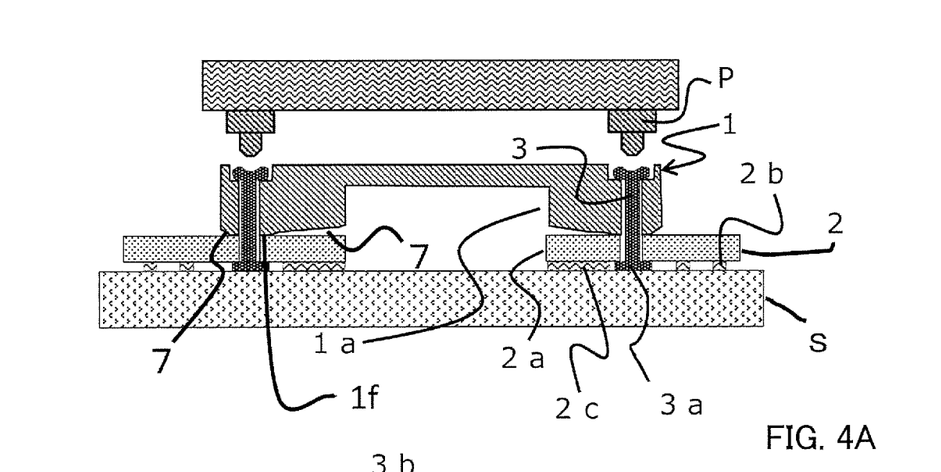
FIG. 4A is a cross-sectional view in which the heat-releasing plate and the board are caulked and FIG. 4B is an enlarged cross-sectional view of the caulked portion and corresponding to the left portion of FIG. 4A in Embodiment 1 of the present disclosure.
Figure 4B:
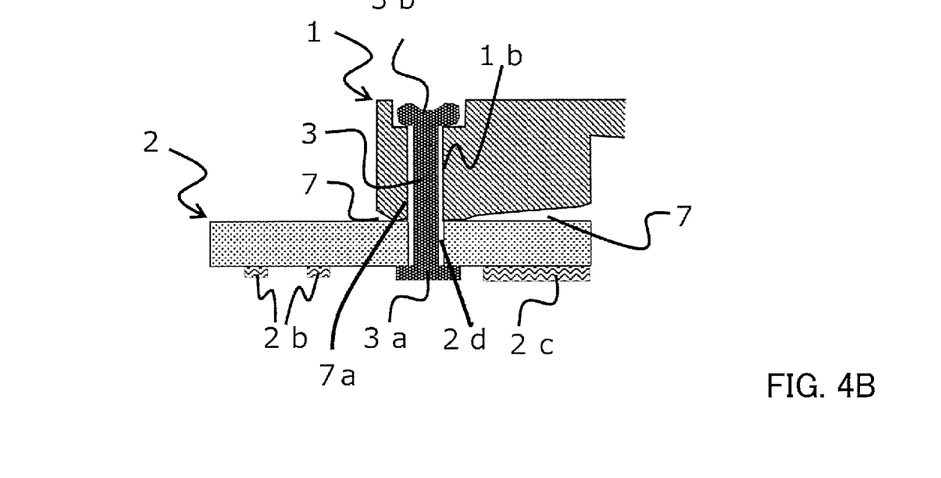

FIG. 4A is a cross-sectional view in which heat-releasing plate 1 and board 2 are caulked in Embodiment 1 of the present disclosure. FIG. 4B is an enlarged cross-sectional view of the caulked portion and corresponding to the left portion of FIG. 4A.

As illustrated in FIG. 4A, heat-releasing plate 1 and board 2 temporarily fixed by inserting rivet 3 into first through-hole 1b and second through-hole 2d are mounted on, for instance, stage S of a pressing machine, and the other end portion of rivet 3, where flange 3a is not formed, is pressed in a direction of the stage (a shaft direction) under a load of 3t by, for instance, caulking punch P. Although rivet 3 is pressed in a direction of board 2 by caulking punch P, rivet 3 per se does not move because flange 3a is in contact with a surface of stage S. As rivet 3 is unmovable in the direction of board 2, the columnar shape of the pressed other end portion of rivet 3 deforms due to pressure from the upper surface in the shaft direction by caulking punch P. Specifically, the other end portion of rivet 3 deforms so as to come into contact with a peripheral edge of first through-hole 1b and presses the peripheral edge of first through-hole 1b in the direction of board 2. On the other hand, because flange 3a of rivet 3 is unmovable, it is possible to caulk heat-releasing plate 1 and board 2 with flange 3a and the deformed portion of the other end portion (other end) (hereinafter, referred to as "pressure contact portion 3b") of rivet 3. Heat-releasing plate 1 and board 2 can be firmly fixed by forming pressure contact portion 3b mentioned above.

As illustrated in FIG. 4B, rivet 3 is pressed from the upper surface in a direction of the lower surface by caulking punch P so that the peripheral edge of first through-hole 1b of heat-releasing plate 1 is pressed downward by pressure contact portion 3b of the other end portion of rivet 3. Accordingly, contact portion 1f is formed at a position on front surface 1c of heat-releasing plate 1 where the peripheral edge of first through-hole 1b and the opposite surface to front surface 2e of board 2 come into firm contact with each other.

Heat-releasing plate 1 crushes at a position away from the peripheral edge of first through-hole 1b rather than contact portion 1f as a result of the peripheral edge of first through-hole 1b being pressed downward by caulking. For this reason, heat-releasing plate 1 deforms in a way that a surface of heat-releasing plate 1 in contact with board 2 warps in a direction away from board 2. As a result of the deformation, gap 7 which is not in contact with board 2 is formed in heat-releasing plate 1 at a position away from first through-hole 1b rather than contact portion 1f which is in contact with board 2. Although not illustrated in the drawings in detail, gap 7 is formed in a way that a space between heat-releasing plate 1 and board 2 gradually widens and spreads from the circumference of contact portion 1f toward the outside, for instance, radially. Gap 7 is formed all over the circumference of contact portion 1f. In addition, gap 7 may not be formed all over the circumference of contact portion 1f. Gap 7 is formed to communicate with, for instance, cavity 1a of heat-releasing plate 1 and opening 2a of board 2 so that heat from an overheated semiconductor or the like is not transmitted to heat-releasing plate 1 via rivet 3. Gap 7 communicates with the outside of heat-releasing plate 1 in order to suppress a rise in the temperature of heat-releasing plate 1. In addition, gap 7 communicating with the outside of heat-releasing plate 1 may not be formed.

In the caulking step, heat-releasing plate 1 and board 2 are caulked by inserting the other end portion of rivet 3 into second through-hole 2d of board 2, and pressing the other end portion in the direction of board 2 from a side of heat-releasing plate 1. However, heat-releasing plate 1 and board 2 may be caulked by inserting the other end portion of rivet 3 into first through-hole 1b of heat-releasing plate 1, and pressing the other end portion in a direction of heat-releasing plate 1 from a side of board 2.

As illustrated in FIG. 4, recessed portions 1e are formed in rear surface 1d of heat-releasing plate 1. As a result of providing recessed portion 1e, pressure contact portion 3b in which flange 3a is not formed and which is pressed and deformed is contained in recessed portion 1e of heat-releasing plate 1. Thus a projecting portion is eliminated from rear surface 1d of heat-releasing plate 1 so that a route for effective heat release, such as disposing a heat sink (not illustrated) on rear surface 1d of heat-releasing plate 1 to come into contact therewith, can be easily ensured.

<Component-Packaging Step>

Figure 5:
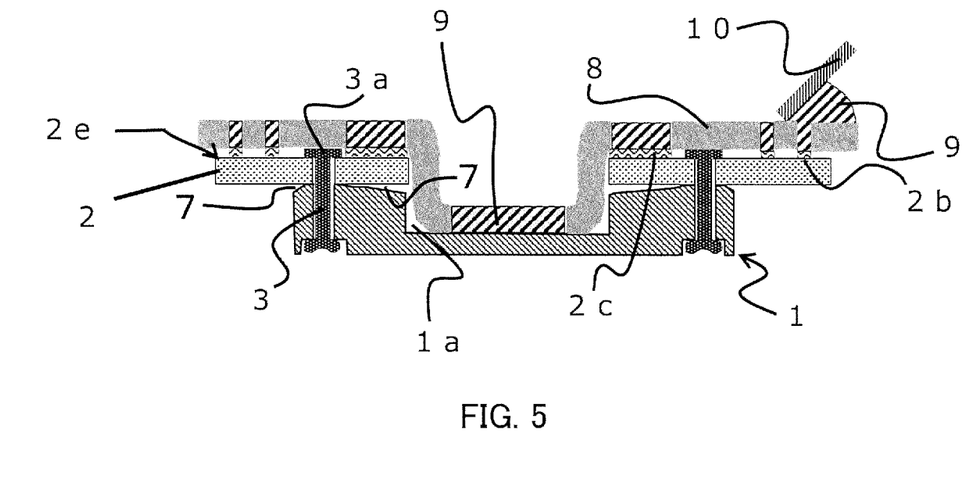
FIG. 5 is a cross-sectional view of a process of supplying a solder paste to the board and the heat-releasing plate in Embodiment 1 of the present disclosure.

FIG. 5 is a cross-sectional view of a process of supplying solder paste 9 to first component lands 2b and second component lands 2c disposed on front surface 2e of board 2, and to cavity 1a of heat-releasing plate 1 in Embodiment 1 of the present disclosure.

As illustrated in FIG. 5, metal masks 8, first component lands 2b and second component lands 2c disposed on front surface 2e of board 2, and cavity 1a of heat-releasing plate 1 are positioned, respectively. Then solder paste 9 is supplied to front surface 2e of board 2, and cavity 1a of heat-releasing plate 1 by a method of e.g. printing by means of squeegee 10. To correspond to the recess of cavity 1a of heat-releasing plate 1, metal mask 8 that is used has the same cavity structure. On the other hand, when not solder paste 9, but a plate-like solder material is used for cavity 1a of heat-releasing plate 1, solder paste 9 may only be supplied to first component land 2b and second component land 2c disposed on front surface 2e of board 2, and metal mask 8 may not have a cavity structure.

Figure 6:
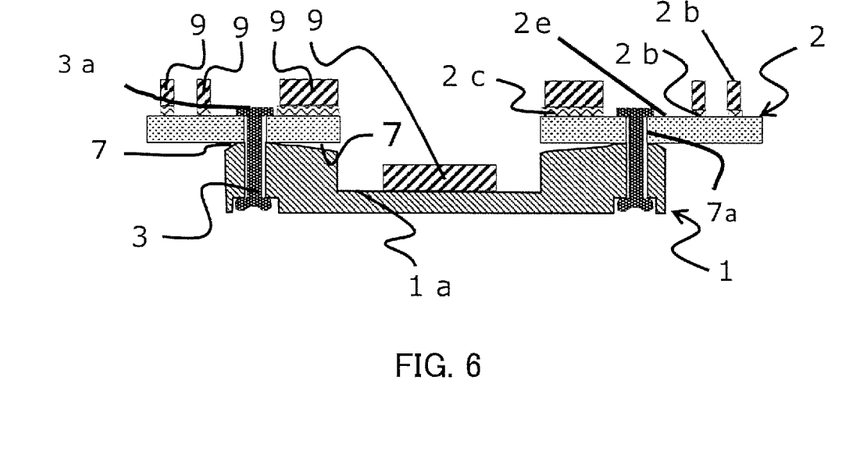
FIG. 6 is a cross-sectional view in which the solder paste is supplied to the board and the heat-releasing plate in Embodiment 1 of the present disclosure.

FIG. 6 is a cross-sectional view in which solder paste 9 is supplied to first component lands 2b and second component lands 2c disposed on front surface 2e of board 2, and to cavity 1a of heat-releasing plate 1 in Embodiment 1 of the present disclosure.

As illustrated in FIG. 6, solder paste 9 for connecting components is supplied to first component lands 2b and second component lands 2c disposed on front surface 2e of board 2, and to cavity 1a of heat-releasing plate 1.

Figure 7:
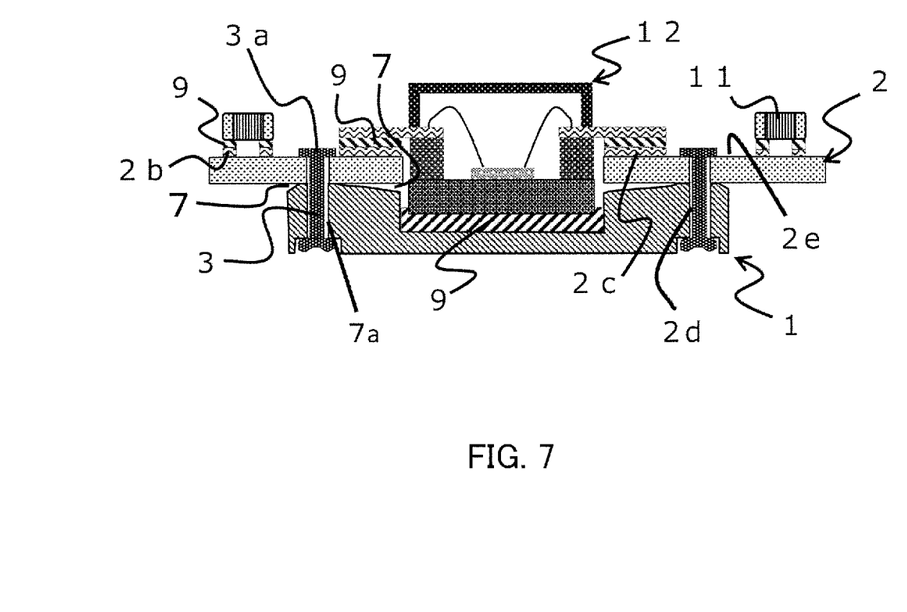
FIG. 7 is a cross-sectional view in which components are mounted on the board in Embodiment 1 of the present disclosure.

FIG. 7 is a cross-sectional view in which components are mounted on board 2 in Embodiment 1 of the present disclosure.

Solder paste 9 is already supplied to each, and chip component 11 is mounted on first component land 2b by means of a mounter (not illustrated). Similarly, semiconductor package 12 is mounted on board 2 and heat-releasing plate 1 by means of a mounter. Subsequently, solder paste 9 supplied on heat-releasing plate 1 and board 2 is melted by heating board 2 and heat-releasing plate 1 to 245 degrees by means of a reflow furnace (not illustrated), and chip component 11 and semiconductor package 12 are fixed to board 2 and heat-releasing plate 1.

The height of flange 3a of rivet 3 projecting from board 2 is preferably lower than the projection heights of chip component 11, semiconductor package 12 and the like to be packaged on board 2. As a result of employing this configuration, the height of flange 3a of rivet 3 projecting from board 2 no longer affects the size of board 2 attached to heat-releasing plate 1 and the size of a module on which board 2 attached to heat-releasing plate 1 is mounted.

As in Embodiment 1, it is preferable to configure that flange 3a of rivet 3 is disposed on a side of front surface 2e of board 2 and pressure contact portion 3b of rivet 3 is disposed on rear surface 1d of heat-releasing plate 1. Because pressure contact portion 3b of rivet 3 is formed by pressing from above, variations in the projection height are likely to occur. The projection height of flange 3a, on the other hand, is uniform from the outset so that front surface 2e of board 2 on which flange 3a is disposed does not have extreme unevenness. Accordingly, the influence on the step of printing the solder paste onto front surface 2e of board 2 and the component-packaging step is relatively lower than that in a case where pressure contact portion 3b is disposed on front surface 2e of board 2.

<Effects>

Through the above-described steps, it is possible to firmly fix heat-releasing plate 1 and board 2 because heat-releasing plate 1 and board 2 are pressed at flange 3a and pressure contact portion 3b of the other end portion of rivet 3 from the vertical direction to come in contact with each other at contact portion 1f generated by caulking heat-releasing plate 1 and board 2, and are held and pressed from the vertical direction by caulking flange 3a and the other end portion of rivet 3.

In addition, clearance 7a of 0.03 to 0.5 mm, for instance, is formed between rivet 3 and second through-hole 2d in board 2 by caulking.

As described above, gap 7 is formed between heat-releasing plate 1 and wiring board 2, and clearance 7a is formed between rivet 3 and second through-hole 2d of board 2. Because heat-releasing plate 1 is in contact with board 2 via contact portion 1f, heat is transmitted from board 2 and can be released to the outside. In addition, heat-releasing plate 1 can release heat efficiently because the range of heat-releasing plate 1 in contact with board 2 represents contact portion 1f with a narrow area so that thermal conduction from heat-releasing plate 1 to board 2 can be suppressed even when, for instance, semiconductor package 12 generates heat during operation.

As a result of the formation of clearance 7a between rivet 3 and second through-hole 2d, heat is not transmitted directly, and thermal conduction to board 2 via rivet 3 can be suppressed. In addition, highly reliable junction can be realized because a thermal expansion difference attributable to the difference in material between heat-releasing plate 1 and board 2 can be absorbed by clearance 7a even when board 2 expands or contracts due to changes in environmental temperature.

In addition, either or both of gap 7 and clearance 7a may be formed.

Embodiment 2

Figure 8A:
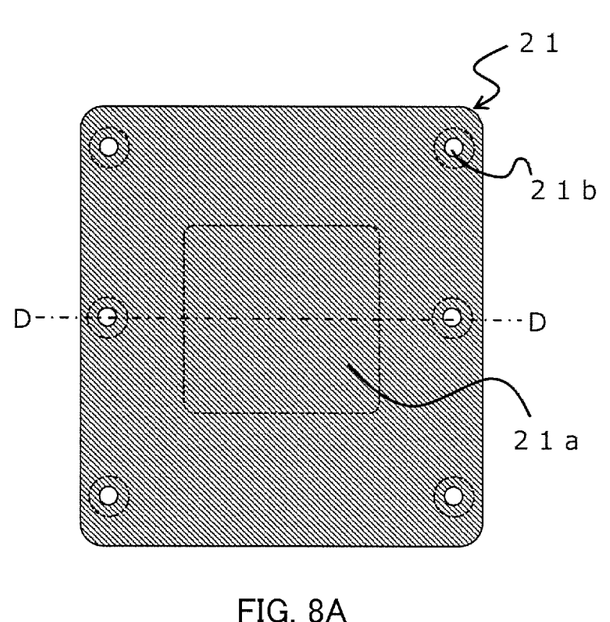
FIG. 8A is a plan view of a heat-releasing plate and FIG. 8B is a cross-sectional view taken along line D-D of FIG. 8A in Embodiment 2 of the present disclosure.

Embodiment 2 is largely common to Embodiment 1. A detailed description of common parts is omitted and different parts have been mainly described. In addition, the diameter of first through-hole 21b of heat-releasing plate 21 (see Table 1 and FIG. 8) in Embodiment 2 differs in size from the diameter of first through-hole 1b in Embodiment 1.

<Heat-Releasing Plate 21>

Figure 8B:
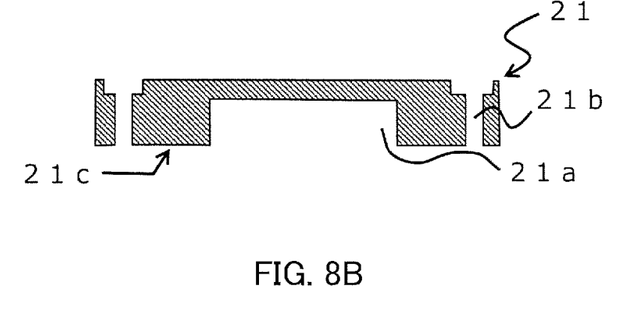

FIG. 8A is a plan view of heat-releasing plate 21 in Embodiment 2 of the present disclosure. FIG. 8B is a cross-sectional view taken along line D-D of heat-releasing plate 21 in Embodiment 2 of the present disclosure. In heat-releasing plate 21, first through-hole 21b for positioning with board 32 (see FIG. 9) and for inserting rivet 3 is formed. In heat-releasing plate 21, cavity 21a formed by a recess so as to be capable of corresponding to the height of components to be mounted on board 32 is also formed on a side of front surface 21c in contact with board 32. As shown in Table 1, first through-hole 21b in Embodiment 2 has a diameter of 2.05 mm, while first through-hole 1b in Embodiment 1 has a diameter of 2.2 mm. First through-hole 21b in Embodiment 2 is formed to have a diameter thinner by 0.15 mm than the diameter of first through-hole 1b in Embodiment 1. The material of and the method for plating heat-releasing plate 21 are the same as those in Embodiment 1, and a description thereof is therefore omitted.

<Board 32>

Figure 9A:
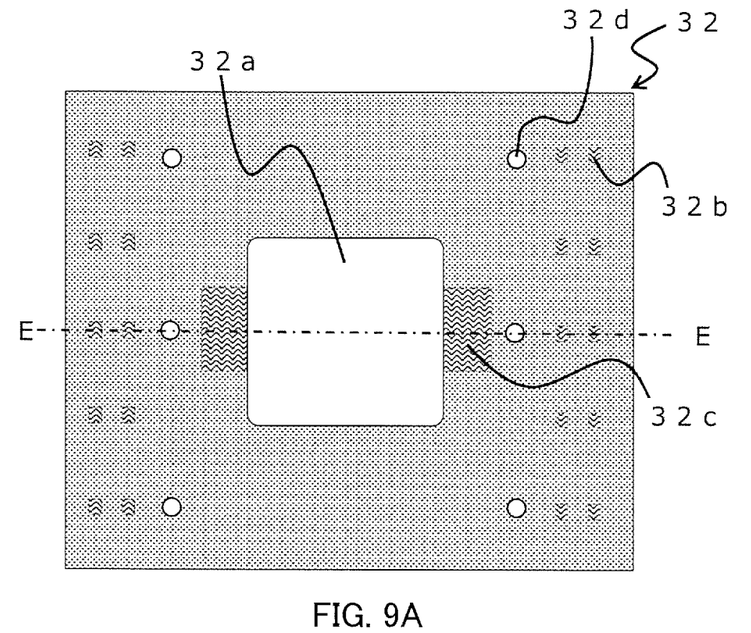
FIG. 9A is a plan view of a board and FIG. 9B is a cross-sectional view taken along line E-E of FIG. 9A in Embodiment 2 of the present disclosure.
Figure 9B:
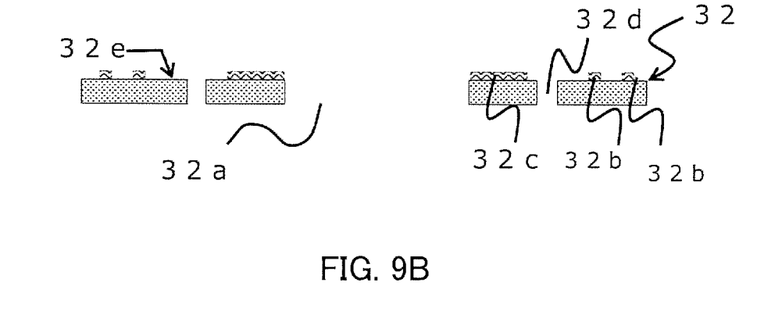

FIG. 9A is a plan view of board 32 in Embodiment 2 of the present disclosure. FIG. 9B is a cross-sectional view taken along line E-E of board 32 in Embodiment 2 of the present disclosure.

Second through-hole 32d is formed in board 32 in the same fashion as in Embodiment 1. In board 32, opening 32a is formed on a side of front surface 21c, and first component land 32b for mounting a chip component, and second component land 32c for mounting a semiconductor package are formed in the same fashion as in Embodiment 1. The method for plating first component land 32b and second component land 32c is the same as that in Embodiment 1, and a description thereof is therefore omitted.

Second through-hole 32d of board 32 has a diameter of 2.2 mm and is formed to have a diameter larger than the diameter of first through-hole 21b of heat-releasing plate 21. Second through-hole 2d and first through-hole 1b are formed to have the same diameter in Embodiment 1, whereas second through-hole 32d and first through-hole 21b have different diameters in Embodiment 2.

<Production Method>

FIGS. 10 to 14 are flow sheets illustrating a method for producing of a wiring board in Embodiment 2 of the present disclosure.

<Laminating, Positioning, and Temporarily Fixing Step>

Figure 10A:
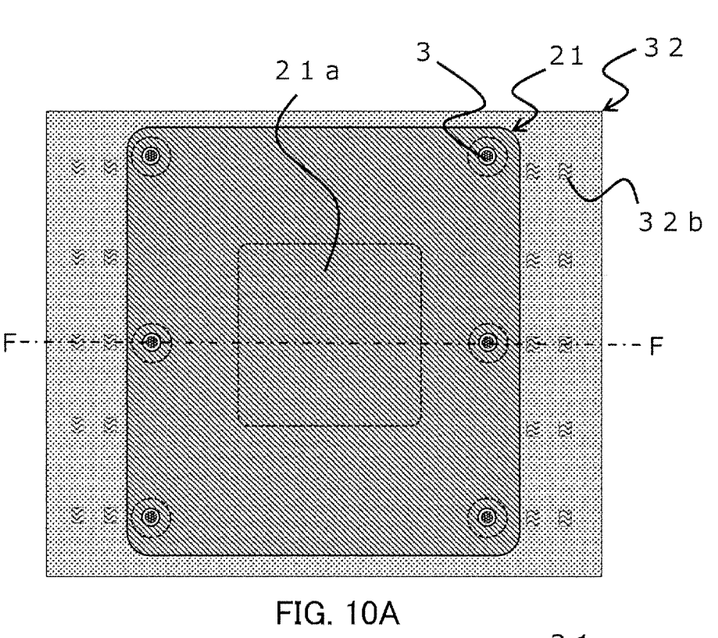
FIG. 10A is a plan view in which the heat-releasing plate and the board are temporarily fixed.
Figure 10B:
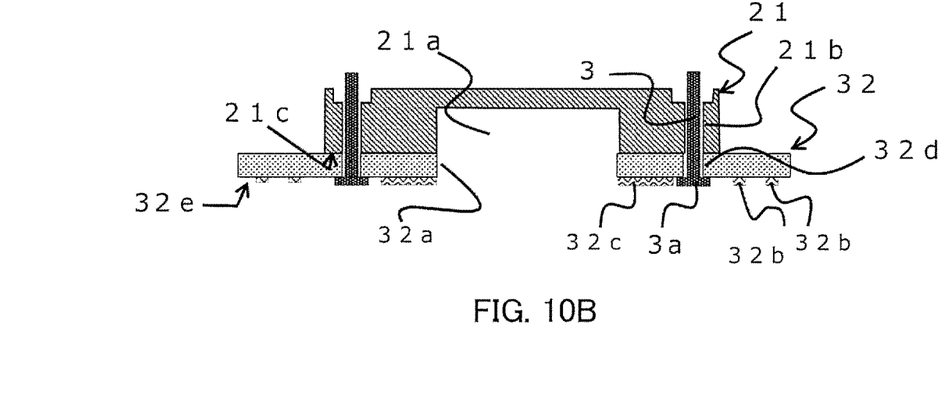
FIG. 10B is a cross-sectional view taken along line F-F of FIG. 10A in Embodiment 2 of the present disclosure.

FIG. 10A is a plan view in which heat-releasing plate 21 and board 32 are temporarily fixed in Embodiment 2 of the present disclosure. FIG. 10B is a cross-sectional view taken along line F-F of FIG. 10A. As illustrated in FIGS. 10A and 10B, front surface 21c of heat-releasing plate 21 and the opposite surface to front surface 32e of board 32 are positioned to face each other by lamination. Then heat-releasing plate 21 and board 32 are positioned and disposed so that first through-hole 21b and second through-hole 32d mutually communicate.

Thereafter, rivet 3 is inserted into second through-hole 32d and first through-hole 21b from a side of front surface 32e of board 32, and heat-releasing plate 21 and board 32 are positioned and temporarily fixed.

As shown in Table 1, the columnar portion of rivet 3 has a diameter of 2.0 mm with a 0.05 mm margin relative to the diameter of first through-hole 21b of heat-releasing plate 21 of 2.05 mm. The margin between rivet 3 and first through-hole 21b in Embodiment 2 is formed to be smaller than that in Embodiment 1. Second through-hole 32d of board 32 has a diameter of 2.2 mm with a 0.2 mm margin relative to the diameter of the columnar portion of rivet 3. First through-hole 21b is formed to have a diameter smaller than that of second through-hole 32d. By arranging the margin in Embodiment 2 to be smaller than that in Embodiment 1, it is possible to eliminate looseness that occurs between first through-hole 21b and rivet 3. Accordingly, the accuracy of positioning heat-releasing plate 21 and board 32 further improves compared with Embodiment 1, and both can be joined with high accuracy.

<Caulking Step>

Figure 11A:
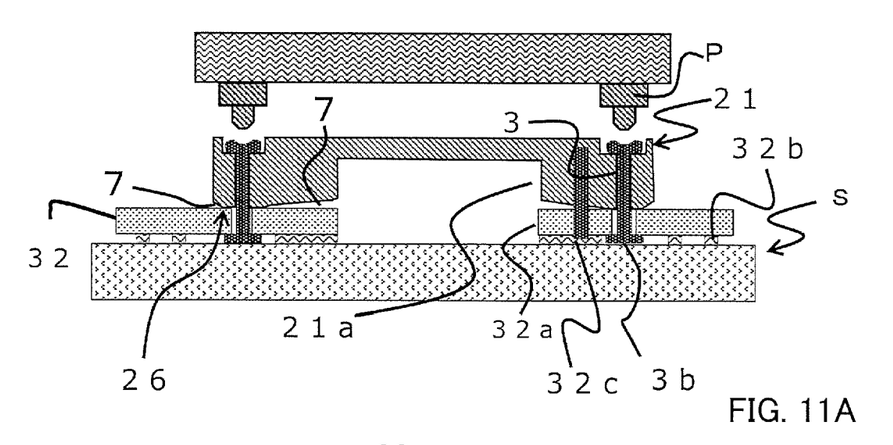
FIG. 11A is a cross-sectional view in which the heat-releasing plate and the board are caulked and FIG. 11B is an enlarged cross-sectional view of the caulked portion and corresponding to the left portion of FIG. 11A in Embodiment 2 of the present disclosure.
Figure 11B:
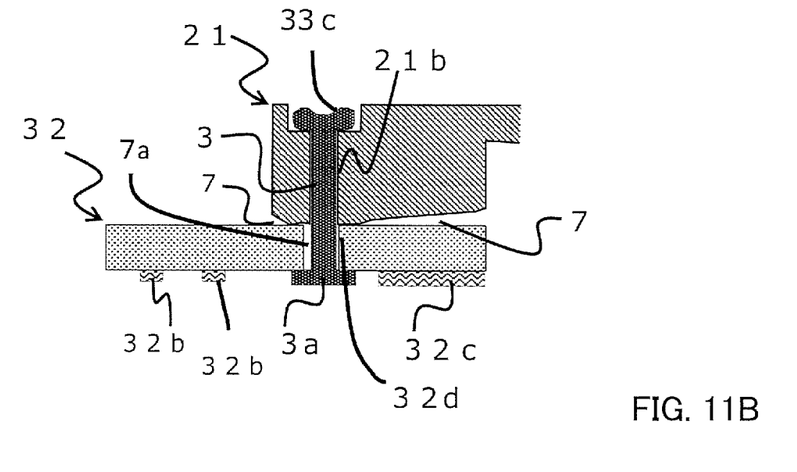

FIG. 11A is a cross-sectional view in which heat-releasing plate 21 and board 32 are caulked in Embodiment 2 of the present disclosure. FIG. 11B is an enlarged cross-sectional view of the caulked portion and corresponding to the left portion of FIG. 11A. As illustrated in FIG. 11A, rivets 3 are inserted into first through-holes 21b and second through-holes 32b, the temporarily fixed heat-releasing plate 21 and board 32 are mounted on, for instance, stage S, and the other end portion of rivets 3, where flange 3b is not formed, is pressed in a direction of the stage (a shaft direction) under a load of 3t by, for instance, caulking punch P. Although rivet 3 is pressed in a direction of board 32 by caulking punch P, rivet 3 per se does not move because flange 3b is in contact with a surface of stage S. As rivet 3 is unmovable in the direction of board 32, the columnar shape of the pressed other end portion of rivet 3 deforms due to pressure from the upper surface by caulking punch P. Specifically, the other end portion of rivet 3 deforms so as to come into contact with a peripheral edge of first through-hole 21b and presses the peripheral edge of first through-hole 21b in the direction of board 32. On the other hand, because flange 3b of rivet 3 is unmovable, it is possible to caulk heat-releasing plate 21 and board 32 with flange 3b and the deformed portion of the other end portion (hereinafter, referred to as "pressure contact portion 33c") of rivet 3. Heat-releasing plate 21 and board 32 can be firmly fixed by forming pressure contact portion 33c mentioned above.

Furthermore, because the columnar portion of rivet 3 is compressed by pressure from the upper surface, the diameter of the columnar portion becomes thicker than that in the state before caulking. The margin between first through-hole 21b and rivet 3 in Embodiment 2 is set to be 0.05 mm smaller than that in Embodiment 1. Because the diameter of the columnar portion of rivet 3 becomes large by caulking, the margin becomes zero or very small after caulking so that rivet 3 and the inner wall of first through-hole 21b are in contact with each other over the substantially entire surface. Because rivet 3 is subjected to vertical pressing by caulking as well as the motion thereof in the horizontal direction in first through-hole 21b is suppressed, heat-releasing plate 21 is more firmly fixed to board 32 than in Embodiment 1.

As shown in Table 1, on the other hand, the diameter of second through-hole 32d has a 0.2 mm margin relative to the diameter of rivet 3 so that the columnar portion of rivet 3 does not come in entire contact with the inner wall of second through-hole 32d even if the diameter of the columnar portion of rivet 3 becomes large by caulking. Accordingly, even if the materials of rivet 3 and board 32 differ, no failure in junction based on the difference in linear expansion due to the different materials occurs.

As shown in Table 1, the reason why the diameter of second through-hole 32d relative to rivet 3 is formed to be larger than the diameter of first through-hole 21b relative to rivet 3 is the same as in Embodiment 1 mentioned above.

In addition, the formation of contact portion 26 and gap 27 by caulking rivet 3 and the action thereof are the same as in Embodiment 1 described above, and a description thereof is therefore omitted.

In the caulking step, heat-releasing plate 21 and board 32 are caulked by inserting the other end of portion of rivet 3 into second through-hole 32d and pressing the other end portion from a side of heat-releasing plate 21 in the direction of board 32. However, heat-releasing plate 21 and board 32 may be caulked by inserting the other end portion of rivet 3 into first through-hole 21b and pressing the other end portion from a side of board 32 in a direction of heat-releasing plate 21.

<Component-Packaging Step>

Figure 12:
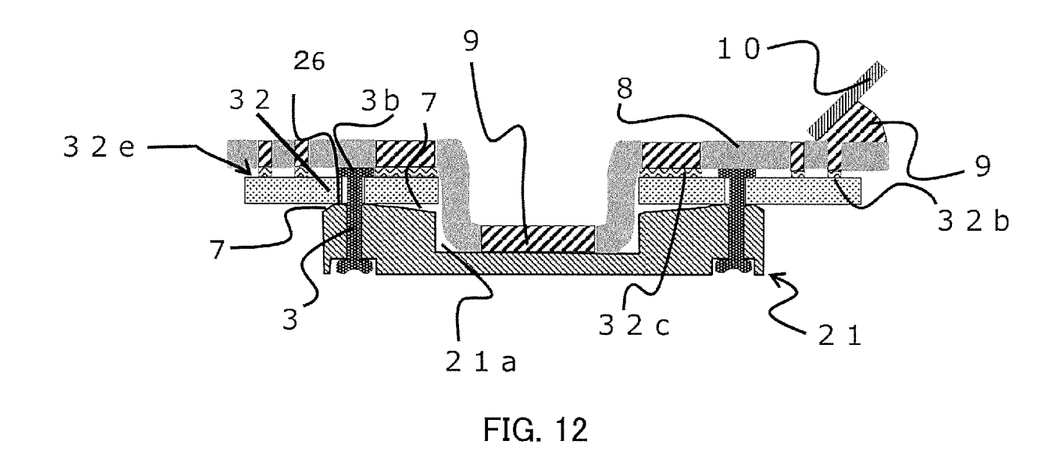
FIG. 12 is a cross-sectional view of a process of supplying a solder paste to the board and the heat-releasing plate in Embodiment 2 of the present disclosure.

FIG. 12 is a cross-sectional view of a process of supplying solder paste 9 to first component lands 32b and second component lands 32c disposed on front surface 32e of board 32, and to cavity 21a of heat-releasing plate 21 in Embodiment 2 of the present disclosure.

Figure 13:
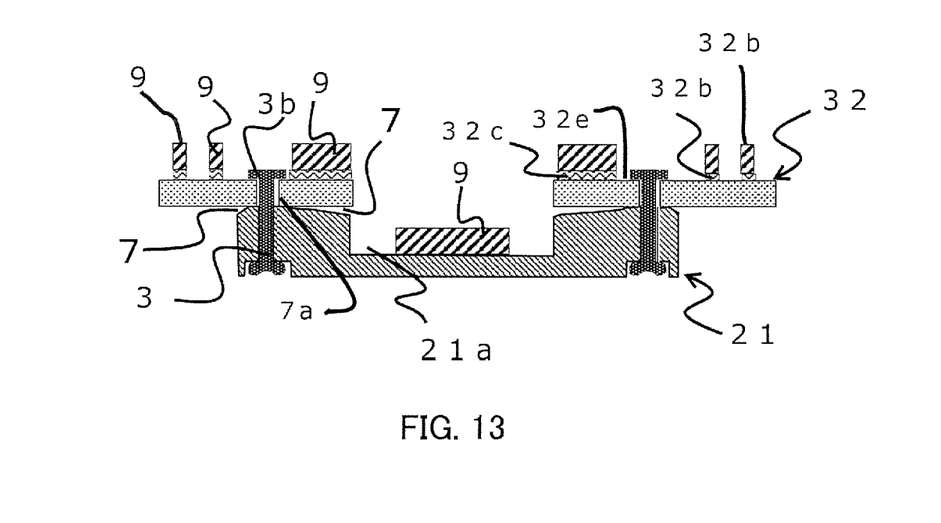
FIG. 13 is a cross-sectional view in which the solder paste is supplied to the board and the heat-releasing plate in Embodiment 2 of the present disclosure.

FIG. 13 is a cross-sectional view in which solder paste 9 is supplied to first component lands 32b and second component lands 32c disposed on front surface 32e of board 32, and to cavity 21a of heat-releasing plate 21 in Embodiment 2 of the present disclosure.

Figure 14:
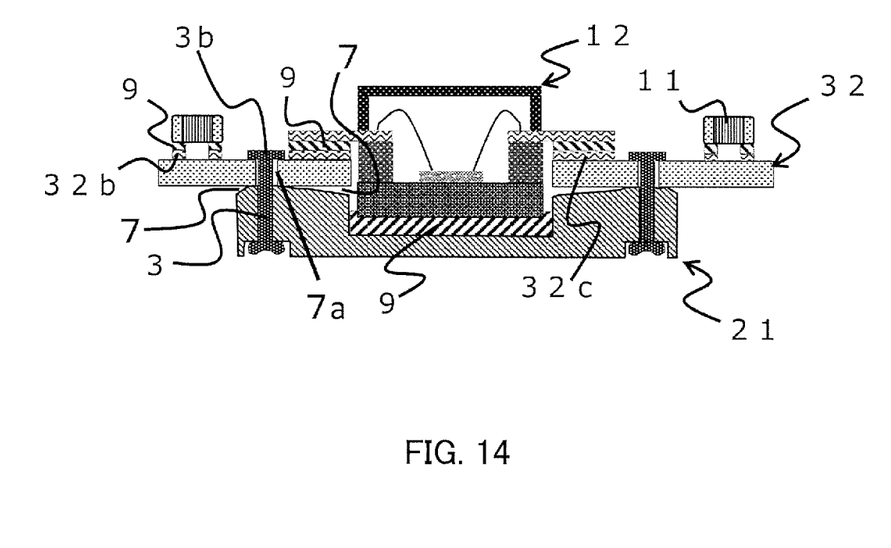
FIG. 14 is a cross-sectional view in which components are mounted on the board in Embodiment 2 of the present disclosure.

FIG. 14 is a cross-sectional view in which components are mounted on board 32 in Embodiment 2 of the present disclosure.

Disposing first component land 32b, second component land 32c, and cavity 21a on heat-releasing plate 21 and board 32, supplying solder paste 9 thereto, and fixing first component land 32b, second component land 32c, and cavity 21a are the same as in Embodiment 1 described above, and a description thereof is therefore omitted.

<Effects>

The point that heat-releasing plate 21 and board 32 are firmly fixed as a result of caulking rivet 3 through the steps in Embodiment 2 is the same as in Embodiment 1 described above, and a description thereof is therefore omitted.

In addition, the formation of clearance 7a of 0.03 to 0.5 mm, for instance, between rivet 3 and second through-hole 32d in board 32 by caulking and the effects thereof are the same as in Embodiment 1 described above, and a description thereof is therefore omitted.

In addition, either or both of gap 27 and clearance 7a may be formed.

INDUSTRIAL APPLICABILITY

The wiring board according to the present disclosure is useful for devices in their entirety in which a power device is mounted on a heat-releasing plate.

REFERENCE SIGNS LIST

1: Heat-releasing plate
1a Cavity

1b First through-hole
1c Front surface
1d Rear surface
1e Recessed portion
1f Contact portion
2 Board
2a Opening
2b First component land
2c Second component land
2d Second through-hole
2e Front surface
3 Rivet
3a Flange
3b Pressure contact portion
7 Gap
7a Clearance
8 Metal mask
9 Solder Paste
10 Squeegee
11 Chip component
12 Semiconductor package
21 Heat-releasing plate
21a Cavity
21b First through-hole
21c Front surface
26 Contact portion
27 Gap
32 Board
32a Opening
32b First component land
32c Second component land
32d Second through-hole
32e Front surface
3 Rivet
3b Flange
33c Pressure contact portion
S Stage
P Caulking punch P

The invention claimed is:

1. A wiring board comprising:
a rod-shaped shaft member including at one end a flange that has a larger diameter than any other portion;
a heat-releasing plate including a first through-hole in which the shaft member is inserted; and
a substrate including a second through-hole in which the shaft member is inserted, wherein:
a gap is formed at least in part between the heat-releasing plate and the substrate,
the heat-releasing plate has a front surface at least part of which is in contact with the substrate, and a rear surface on which the flange or the pressure contact portion is disposed; and
a recessed portion having such a depth that the flange or the pressure contact portion does not project from the rear surface of the heat-releasing plate is formed around the first through-hole on the rear surface of the heat-releasing plate.

2. The wiring board according to claim 1, wherein
the substrate has a front surface on which an electronic component is packaged and on which the flange or the pressure contact portion is disposed, and a rear surface at least part of which is in contact with the heat-releasing plate; and
a projection height from the substrate of the flange or the pressure contact portion is lower than a projection height from the substrate of the electronic component to be packaged on the substrate.

3. The wiring board according to claim 1, wherein
the flange of the shaft member is disposed on the front surface of the substrate and the pressure contact portion is disposed on the rear surface of the heat-releasing plate.

4. A wiring board comprising:
a rod-shaped shaft member including at one end a flange that has a larger diameter than any other portion;
a heat-releasing plate including a first through-hole in which the shaft member is inserted; and
a substrate including a second through-hole in which the shaft member is inserted, wherein:
a gap is formed at least in part between the heat-releasing plate and the substrate,
an opening is further formed in the heat-releasing plate; and
a plurality of the second through-holes are disposed around the opening.

5. The wiring board according to claim 4, wherein
the gap is formed to communicate with the opening.

6. A method for producing a wiring board,
the wiring board comprising:
a rod-shaped shaft member including at one end a flange that has a larger diameter than any other portion;
a heat-releasing plate including a first through-hole in which the shaft member is inserted; and
a substrate including a second through-hole in which the shaft member is inserted,
wherein:
a gap is formed at least in part between the heat-releasing plate and the substrate, and
the gap is positioned at a part where the heat-releasing plate and the substrate are joined,
the method comprising:
disposing the heat-releasing plate and the substrate so that the first through-hole and the second through-hole are arranged coaxially and are in contact with each other;
inserting the shaft member so as to penetrate the second through-hole and the first through-hole to position and temporarily fix the heat-releasing plate and the substrate;
deforming an opposite end portion to the flange of the inserted shaft member by pressing the opposite end portion in a shaft direction by a pressing device so that the substrate and the heat-releasing plate are caulked; and
deforming a portion of the heat-releasing plate by caulking the substrate and the heat-releasing plate with the shaft member to form the contact portion in contact with the substrate, and forming the gap between the heat-releasing plate and the substrate, the portion of the heat-releasing plate being in close contact with the substrate.

7. A wiring board comprising:
a rod-shaped shaft member including at one end a flange that has a larger diameter than any other portion;
a heat-releasing plate including a first through-hole in which the shaft member is inserted; and
a substrate including a second through-hole in which the shaft member is inserted, wherein:
a gap is formed at least in part between the heat-releasing plate and the substrate, and
the gap is positioned at a part where the heat-releasing plate and the substrate are joined, wherein
the gap is formed in a way that a space between the heat-releasing plate and the substrate gradually widens and spreads.

8. The wiring board according to claim 7, wherein the gap is formed in a way that the space gradually widens and spreads from the circumference of contact portion of the heat-releasing plate and the substrate toward the outside.

9. The wiring board according to claim 8, wherein the gap is formed in a way that the space gradually widens and spreads from the circumference of contact portion of the heat-releasing plate and the substrate toward the outside radially.

10. The wiring board according to claim 8, wherein the contact portion is positioned at a part where a peripheral edge of the first through-hole and a peripheral edge of the second through-hole are facing each other.

11. The wiring board according to claim 10, wherein the gap is positioned at a circumference of the contact portion.

* * * * *